United States Patent
Sasaki et al.

(10) Patent No.: US 6,457,368 B1
(45) Date of Patent: Oct. 1, 2002

(54) NOISE REDUCED PRESSURE SENSOR

(75) Inventors: Keiji Sasaki; Junichi Miyano, both of Tokyo (JP)

(73) Assignee: Fujikoki Corporation, Tokyo (JP)

(*) Notice: Subject to any disclaimer, the term of this patent is extended or adjusted under 35 U.S.C. 154(b) by 0 days.

(21) Appl. No.: 09/702,682

(22) Filed: Nov. 1, 2000

(30) Foreign Application Priority Data

Nov. 2, 1999 (JP) .......................................... 11-312611

(51) Int. Cl.$^7$ ................................................ G01L 9/00
(52) U.S. Cl. ...................................................... 73/753
(58) Field of Search ............................ 73/754, 753, 721, 73/756; 29/25.35, 592.1

(56) References Cited

U.S. PATENT DOCUMENTS

| | | | |
|---|---|---|---|
| 4,129,042 A | * 12/1978 | Rosvold | 73/727 |
| 4,972,716 A | * 11/1990 | Tobita et al. | 73/721 |
| 5,635,649 A | * 6/1997 | Tobita et al. | 73/716 |
| 6,131,467 A | * 10/2000 | Miyano et al. | 73/756 |
| 6,176,137 B1 | * 1/2001 | Sasaki et al. | 73/754 |
| 6,186,009 B1 | * 2/2001 | Miyano et al. | 73/756 |

FOREIGN PATENT DOCUMENTS

| | | |
|---|---|---|
| DE | 4442478 | 6/1995 |
| EP | 949494 | 10/1999 |
| JP | 10-332516 | 12/1998 |
| JP | 11-201852 | 7/1999 |
| JP | 2000-105163 | 11/2000 |

* cited by examiner

Primary Examiner—Benjamin R. Fuller
Assistant Examiner—Andre Allen
(74) Attorney, Agent, or Firm—Rader, Fishman & Grauer, PLLC

(57) ABSTRACT

A pressure sensor 1—1 comprises a housing 10 having a pressure introduction hole 12, a sensor element 20 having semiconductor elements 22 with piezoresist effects, a holder 30 for fixing the sensor element 20, and a pressure case 60 having electromagnetic shield effect. The sensor element 20, holder 20 and pressure case 60 are welded airtightly so as to form a pressure sensor body formed with a reference pressure space. The pressure sensor body is retained in an electrically insulated manner in the housing 10.

4 Claims, 6 Drawing Sheets

NOISE REDUCED PRESSURE SENSOR

FIELD OF THE INVENTION

The present invention relates to a pressure sensor. More specifically, the present invention relates to an absolute pressure type or a shield gauge pressure type pressure sensor which is equipped with a housing storing a sensor element and a connector case, which eliminates the influence of electromagnetic noise.

Moreover, the present invention relates to an absolute pressure type or a shield gauge pressure type pressure sensor capable of lowering the influence of high-frequency electromagnetic noise greatly. DESCRIPTION OF THE RELATED ART The present applicant has filed a patent application as Japanese Patent Application No. H10-277629 disclosing a pressure sensor for detecting the pressure of a fluid, comprising a housing made of metal having an inner space connected to a pressure detecting space and a thin rising portion at the upper end thereof, a cylindrical pressure case made of metal having a diaphragm separating the inner space into upper and lower spaces and a thin rising portion at the upper end thereof, and a connector case made of an insulating material, said pressure sensor storing both a sensor element for detecting pressure and an electric circuit in the inner space defined by stacking the housing, the pressure case and the connector case and integrating the same by caulking each rising portion, wherein a perforating condenser is provided to the pressure case.

As a result of the study on the influence of the electromagnetic noise to the output voltage using the pressure sensor mentioned above, it had been discovered that, as is indicated in FIG. 6, the output is varied due to injection noise in the range below 10 MHz, and in the range of 10 MHz to 100 MHz. That is, when an electromagnetic noise of 10 MHz or lower is supplied, the output voltage varied in the range of −6% to +4%, and when an electromagnetic noise in the range of 10 MHz to 100 MHz is supplied, the output voltage varied in the range of −3% to +5%.

SUMMARY OF THE INVENTION

The present invention aims at reducing the change of output voltage due to electromagnetic noise, in an absolute pressure type or a shield gauge pressure type pressure sensor.

In order to achieve the above-mentioned aim, the pressure sensor of the present invention comprises a housing having a pressure induction hole, a sensor element comprising semiconductor elements having piezoresisting effects, a holder for fixing said sensor element, and a pressure case having an electromagnetic shield effect, wherein said sensor element, said holder and said pressure case are welded airtightly so as to define a pressure sensor body including a reference pressure space, characterized in that said pressure sensor body is retained in an electrically insulated manner within said housing.

The present invention formed the electrical insulator constituting the electrical insulation between the above-mentioned pressure sensor body and said housing as a cylindrical insulator formed of an electrical insulator inserted between the above-mentioned pressure sensor body and said housing and having at the circumference thereof a rising portion, that is, an insulator sleeve.

The present invention provided to the upper side of said pressure sensor a connector case formed of an electrical insulator and having its one end opened, the opening end portion of said connector case is extended so as to constitute said electrical insulator.

The present invention provided airtightly a perforating condenser to the above-mentioned pressure case, said perforating condenser introducing the output from the above-mentioned sensor element to a predetermined external terminal.

The present invention connected a large capacity condenser in parallel to the above-mentioned perforating condenser.

DETAILED DESCRIPTION OF PREFERRED EMBODIMENTS

Figure 1:
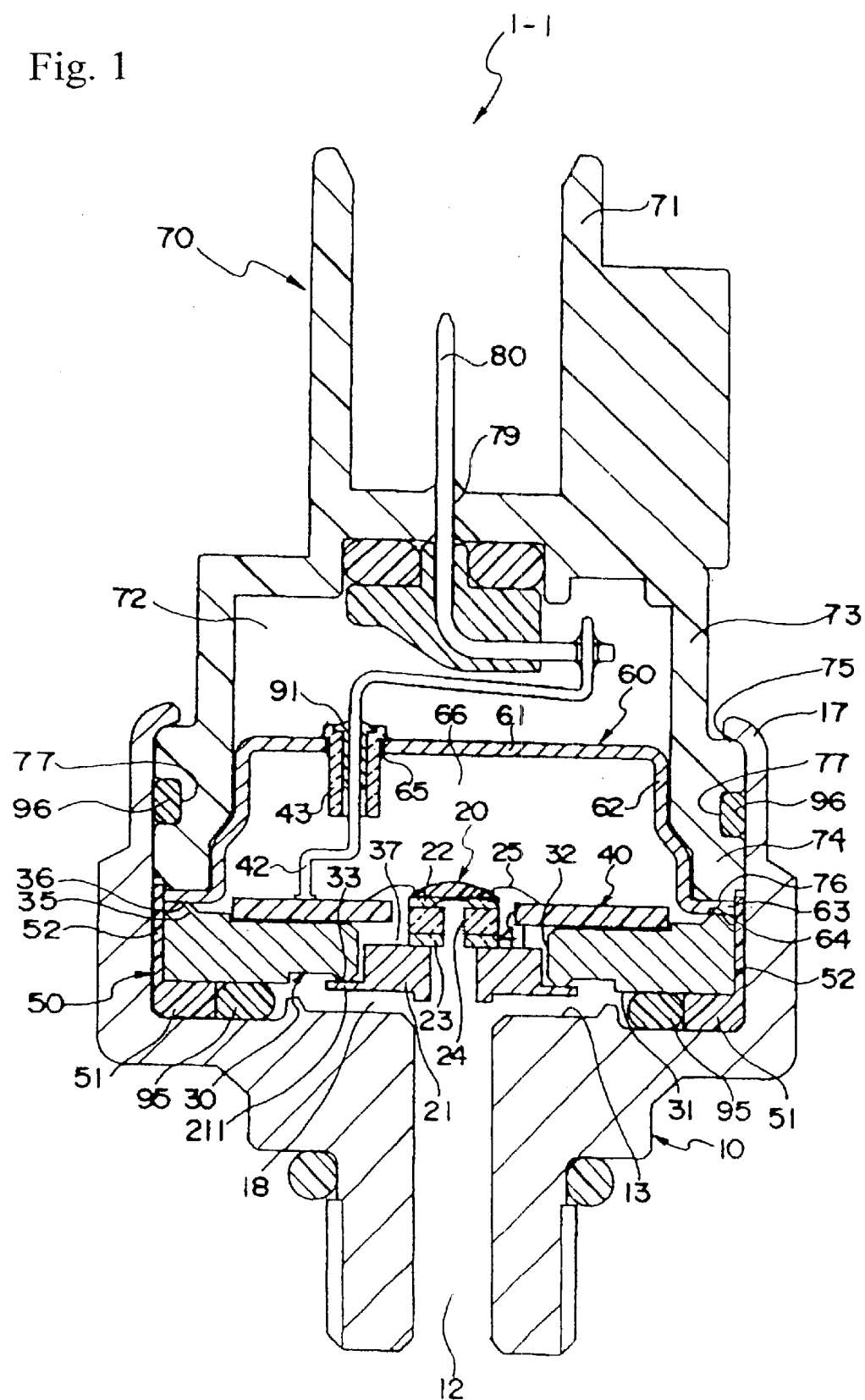
FIG. 1 is a vertical cross-sectional view showing the configuration of the pressure sensor according to the first embodiment of the present invention.

Next, the first embodiment of a pressure sensor according to the present invention will now be explained with reference to FIG. 1. FIG. 1 is a vertical cross-sectional view showing the configuration of the pressure sensor.

A pressure sensor 1—1 according to the first embodiment of the present invention is constituted of a housing 10, a sensor element 20, a holder 30, a circuit board 40, an insulated sleeve 50, a pressure case 60, and a connector case 70.

The pressure sensor 1—1 has a pressure sensor body comprising the sensor element 20, the holder 30 and the pressure case 60 stored inside a container formed by the housing 10 and the e connector case 70.

The housing 10 is formed for example of aluminum in a substantially cylindrical shape. The housing 10 has a fluid induction opening 12 formed to the lower portion thereof, and a circular bottom 13 formed above the opening 12, and is constituted from an annular groove 14 working as a O-ring receiver at the fringe thereof, a surrounding wall 16 rising from the outer circumference of said annular groove, a thinned portion 17 provided to the upper end of said surrounding wall, and an inner space 18 formed inside the body from the bottom and the surrounding wall.

The fluid induction opening 12 of the housing 10 and the inner space 18 are communicated to each other.

The housing 10 is f fixed by screwing a screw portion provided to the outer peripheral of the fluid induction opening 12 of the housing 10 to the piping placed at the pressure measurement side.

The sensor element 20 holds the function of detecting pressure, and is constituted from a header 21 made of metal, a pressure detecting element 22 comprising semiconductor elements possessing a piezoresistance effect by providing plural resists to form bridges to the upper surface of the semiconductor substrate, a lower base 23 made of silicon fixed airtight to the upper surface of the header 21, and an upper base 24 made of glass which is surmounted and fixed airtightly to the upper portion of the lower base 23.

The lower base 23 is surmounted and fixed to the upper surface of the header 21, the upper base 24 is airtightly surmounted and fixed to the upper surface of the lower base 23, and the pressure detecting element 22 is surmounted and fixed to the upper surface of the upper base 24 so that the surface provided with resists becomes the upper surface.

A collar 211 is provided to the lower peripheral of the header 21.

The planar surface of the semiconductor substrate of the pressure detecting element 22 is formed in a rectangle, and to the center area of the pressure detecting element 22 is provided a thin diaphragm portion which deforms with pressure. To the upper surface of the diaphragm portion is provided a pressure detecting unit which is a strain gauge formed by mounting a plural resists in bridge shape as piezoresistors, and on the thick peripheral portion are mounted electric circuits such as amplifying circuit or arithmetic circuit formed using integrated circuit production technique.

Moreover, the land not shown provided to the upper surface of the pressure detecting element 22 and the land not shown provided to the upper surface of the circuit board 40 are connected by a bonding wire 25.

The upper base 24 made of glass such as Pyrex glass (registered trademark) has a rectangular plane, and is formed in a shape provided with a perforation to the center thereof.

The lower base 23 made of silicon has a rectangular plane, and is formed in a shape provided with a perforation to the center thereof. A gold plating layer is formed by sputtering gold and the like to the contact surface of the lower base 23 to the header 21.

The header 21 composed of steel-nickel system alloy such as 42 alloy has a circular plane, and is formed in a shape provided with a perforation to the center thereof. A gold plating layer is formed to the contact surface of the header 21 to the lower base 23.

The perforations of the upper base 24, the lower base 23 and the header 21 are respectively aligned on the same axis, connected to the fluid induction opening 12 of the housing 10, and configurated so as to guide the pressure fluid to the space provided to the rear surface of the pressure detecting element 22.

The lower surface of the pressure detecting element 22 is deposited and fixed airtightly to the upper surface of the upper base 24 through anode junction (FAB junction), the lower surface of the upper base 24 is deposited and fixed airtightly to the upper surface of the lower base 23 through anode junction, and the lower surface of the lower base 23 and the upper surface of the header 21 are deposited and fixed air-tightly with formation of gold-silicon alloy by providing a gold-silicon raw material between the lower base 23 and the header 21, and performing the compression bonding (scrubbing) thereto.

The holder 30 defines a reference pressure space with the pressure case 60.

The holder 30 formed for example using stainless steel is provided with an opening 32 to the center thereof, and is provided with an annular projection 33 formed annularly to the peripheral of the opening 32 on the bottom 31. An annular projection 35 having a welding surface 36 to the pressure case 60 is provided to the outer circumference of the upper surface 34 of the holder 30.

The annular projection 33 provided to the lower surface 31 of the holder 30 is connected to the upper surface of the collar 211 of the header 21 of the sensor element 20, and is fixed airtightly by, for example, projection welding.

The circuit board 40 is fixed to the upper surface 34 of the holder 30 using adhesive and the like.

The circuit board 40 comprising an insulated printed circuit board is provided with an opening 41 to the center thereof where the pressure detecting element 22 of the sensor element 20 is to be located, is equipped with a circuit for amplifying and operating the electric signal from the pressure detecting element 22, and is provided with a lead 42 for transmitting the signal to the exterior.

The pressure case 60 is formed, for example, with stainless steel, and functions both as an electromagnetic shield by covering the sensor element 20 provided to the inner space and protecting it from external noises, and as a member for forming the airtight inner space.

The pressure case 60 comprises a disk-like ceiling 61, a surrounding wall 62 descending from the peripheral thereof, a collar 63 formed by bending the leading edge of the surrounding wall 62 and provided with a welding surface 64 for connecting to the welding surface 36 of the annular projection 35 of the holder 30 to the lower surface thereof, and an opening 65 to which a perforating condenser constituting the lead draw out portion is inserted. An interior space 66 is formed within this hat-like pressure case 60.

The welding surface 64 provided to the lower surface of the collar 63 of the pressure case 60 connects to the welding surface 36 of the annular projection 35 of the holder 30, and is welded airtightly together through electron-beam welding and the like.

The leading edge of the lead 42 of the circuit board 40 is drawn out to the exterior of the pressure case 60 through a perforation hole of a pipe-like dielectric 43 constituting the perforating condenser. The perforation hole of the dielectric 43 with the lead 42 perforated therethrough is sealed using a solder 91.

The connector case 70 is a resinous case to which is inserted and fixed the terminal 80, and comprises a socket 71 provided to the upper portion thereof, an inner space 72 provided to the lower side of the socket 71, a surrounding wall 73 descending downwardly, a thickened portion 74 provided to the lower side of the surrounding wall 73, caulked portion 75 provided to the outer upper portion of the thickened portion, a flat surface 76 at the lower end of the surrounding wall, an O-ring receiving portion 77, and a terminal insertion hole 79 for inserting the terminal 80. The terminal 80 is inserted to the terminal insertion hole 79 from the lower side thereof and is fixed thereto.

By changing the shape of the connector case 70, it could correspond to various connectors having different shapes.

The circuit board 40 consists of an insulated resin and the like, and is composed in a square shape. To the central portion thereof is an opening 41 for arranging said sensor element 20. The surface of the circuit board 40 is mounted with circuit elements constituting an amplification circuit for arithmetic circuitry which are not shown, and the signal from the pressure detecting element 22 is inputted to the circuit element mentioned above through the bonding wire 25.

The lead 42 is an electric conductor connecting the input/output terminal (land portion) provided to the circuit board 40 and the terminal 80, and includes therein a signal wire, a power supply wire and a ground wire. The root of the lead 42 is rested on the land portion not shown provided on the circuit board 40, and is electrically connected and fixed by soldering and the like.

The lead 42 drawn out from the pressure case 60 through the perforating condenser is connected to the lower end of the terminal 80 by soldering.

The power supply wire and the ground wire of the terminal 80 are used to supply power to electric circuits, and the connecting wire and the signal wire thereof are used to transmit the output signal from the sensor element 20 to the exterior.

An O-ring 95 and a ring 96 are inserted respectively to the O-ring receiving groove (annular groove) 14 and the O-ring receiving groove 77, and prevents water, moisture and the like from entering the inner space 72 of the connector case 70 from the exterior.

The insulating sleeve 50 interposed between the housing 10 and the pressure sensor body storing the pressure sensor element 20 inside the space formed by welding the holder 30 and the pressure sensor 60 airtightly is composed of an electric insulating material and forms electric insulation between the housing 10 and the pressure sensor body.

The insulating sleeve 50, in this embodiment is composed of, for example, PPS(polyphenylene sulfide) film, and is composed from a collar 51 interposed between the bottom surface 13 of the housing 10 and the lower surface 31 of the holder 30, and a rising portion 52 rising from the circumference of the collar 51 and interposed between the inner wall of the rising portion 16 of the housing 10, the outer surrounding wall of the holder 30 and the outer surrounding wall of the collar 63 of the pressure case 60.

When the electric insulation between the bottom surface 13 of the housing 10 and the lower surface 31 of the holder 30 may be maintained by the O-ring 95, the collar 51 may be omitted.

Next, the assembly procedure of the pressure sensor 1—1 using these components will be explained.

The sensor element 20 assembled by fixing on the header 21 the laminated body formed by the pressure detecting element 22, the upper base 24 and the lower base 23 is inserted to the opening 32 of the holder 30, and the upper surface of the collar 211 of the header 21 is rested on the annular projection 33. By pressing an annular projection electrode having substantially the same shape with the annular projection 33 from the back of the collar 211, the collar is welded and fixed airtightly to the annular projection 33.

Next, after mounting the circuit board 40 to the upper surface 34 of the holder 30 using an adhesive, the land portion of the pressure detecting element 22 and the land portion of the circuit board 40 are connected using the bonding wire 25.

The lead 42 provided to the circuit board 40 is aligned and inserted to the perforation hole of the perforating condenser soldered to the opening 65 for the perforating condenser of the pressure case 60, and after contacting the welding surface 64 of the collar 63 of the pressure case 60 to the welding surface 36 of the annular projection 35 of the holder 30, the opening of the pressure case 60 is closed by pouring the solder 91 to the perforation hole of the perforating condenser.

At this point, by making the pressure of the inner space to be vacuum or decompressed, the melted solder 91 fills the perforation hole completely.

Then, by using an electron-beam welding and the like, the welding surface 64 of the collar 63 and the welding surface 36 of the annular projection 35 are welded together. Welding is carried out under high vacuum, therefore the inner space 66 is maintained to be vacuum.

As explained, the welding can be carried out easily and securely owing to the collar, and it is possible to assemble the pressure sensor body with the inner spaces 37 and 66 being airtight reference pressure space.

Next, the leading edge of the lead 42 projected above the pressure case 60 is soldered to the terminal 80 mounted to the connector case 70. Then, the connector case 70 is put on top of the pressure sensor body interposing a waterproof O-ring 96 therebetween.

After inserting the insulating ring 50 from the lower portion of the pressure sensor assembly, the pressure sensor body and the connector case assembly obtained by the above-mentioned process are inserted to the inner space 18 of the housing 10 with the O-ring 95 arranged in the O-ring receiver 14 of the housing 10, thereby storing the pressure sensor assembly inside the inner space 18 of the housing 10. In the present embodiment, the pressure sensor assembly is placed at a predetermined position inside the housing inner space 18 by placing the collar 51 of the insulating sleeve 50 between the bottom surface of the annular groove 14 of the housing 10 and the lower surface 31 of the holder 30.

Next, by caulking the thinned portion 17 at the upper end of the rising portion (surrounding wall) 16 of the housing 10 on the caulked portion 75 of the connector case 70, the housing 10 and connector case 70 are fixed together.

With the process mentioned above, the pressure sensor 1—1 having an insulator interposed between the pressure sensor assembly and the housing 10, in other words, having insulation between the pressure case 60 and the housing 10 is assembled.

Figure 2:
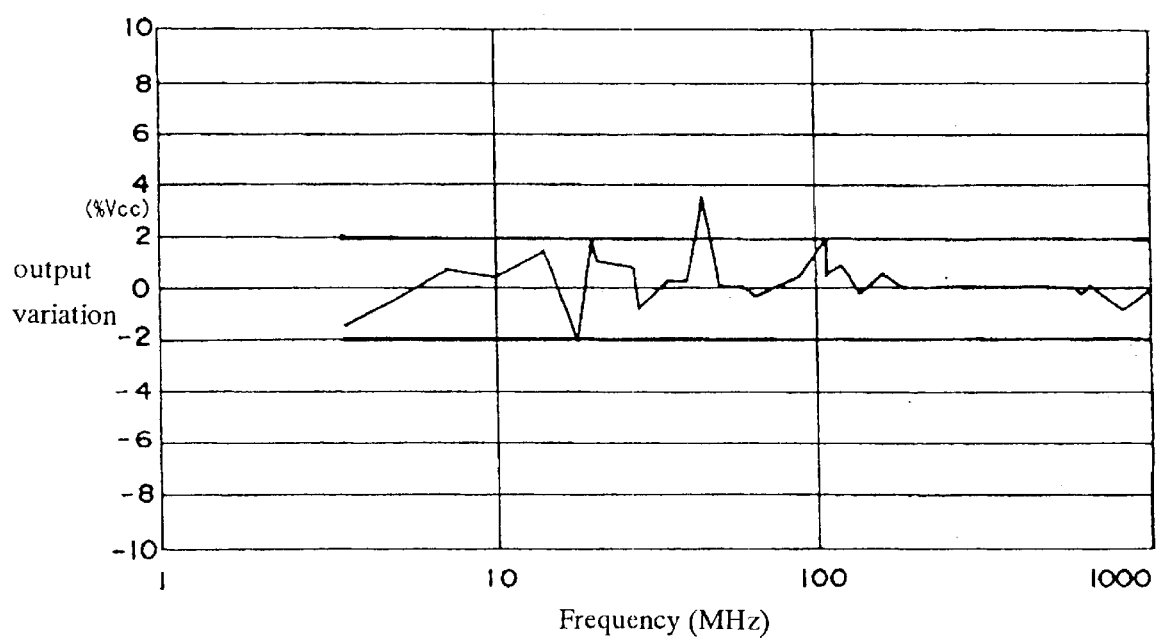
FIG. 2 is a graph showing the output characteristic of the pressure sensor according to the first embodiment of the present invention.

Study on the influence of electromagnetic noise to the output voltage of the pressure sensor 1—1 shows, as is shown in FIG. 2, that when an electromagnetic noise of 10 MHz or less is supplied, the change of output voltage stays in the range of ±2%, and when an electromagnetic noise of 10 MHz to 100 MHz is supplied, the output voltage changes in the range of ±4%, thereby reducing the change of the output voltage.

The pressure sensor 1—1 having the composition mentioned above could eliminate the influence of electromagnetic noise of 10 MHz or lower to the variation of the output voltage.

However, it is not sufficient enough to eliminate the influence of electromagnetic noise in the range of 10 MHz to 100 MHz.

The second embodiment of the present invention sufficiently eliminates the influence of electromagnetic noise even in the range of 10 MHz to 100 MHz in the pressure sensor of the first embodiment, and is characterized in connecting in parallel a large capacity three-terminal condenser to the perforating condenser.

Figure 3:
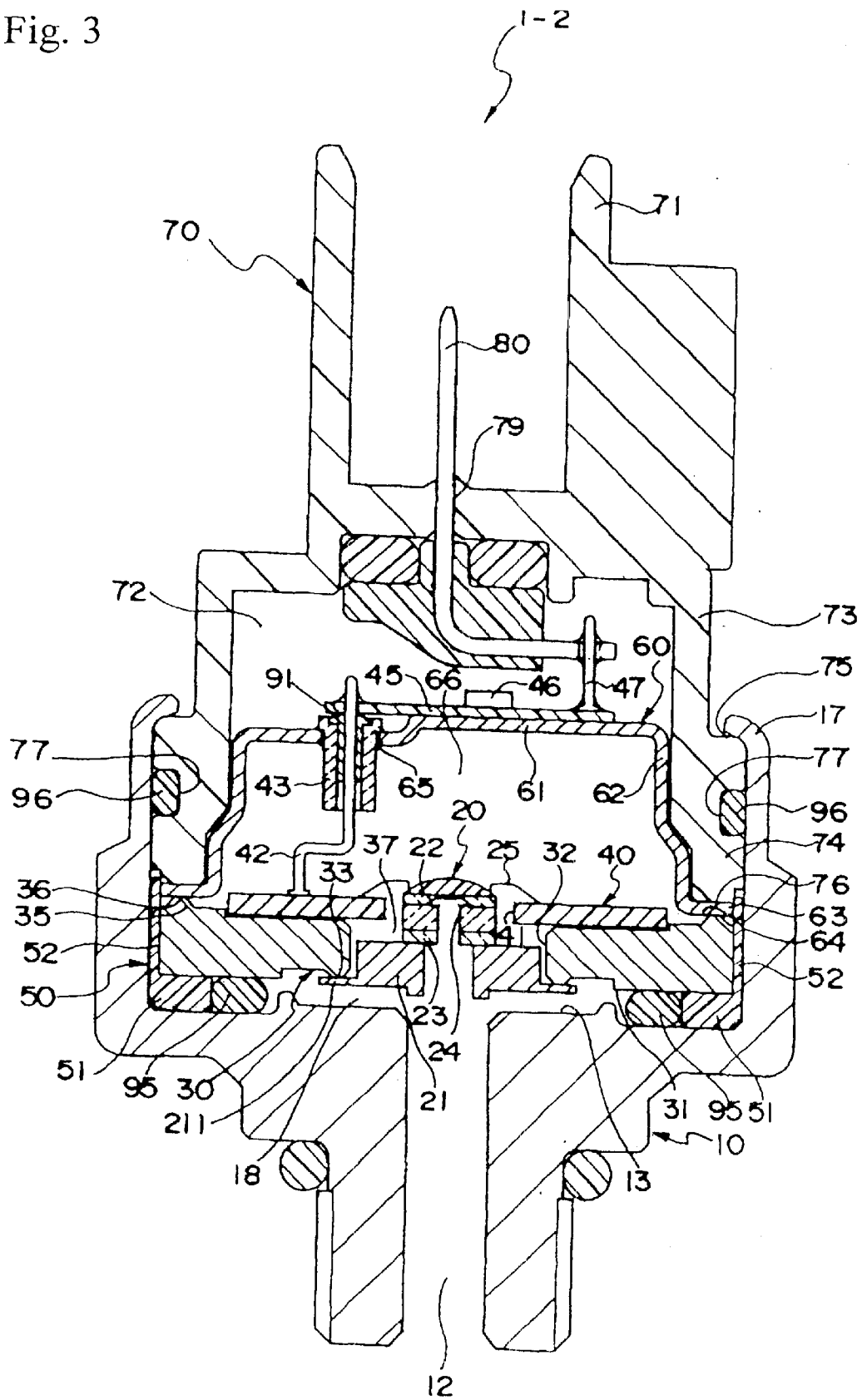
FIG. 3 is a vertical cross-sectional view showing the configuration of the pressure sensor according to the second embodiment of the present invention.

The composition of a pressure sensor 1–2 according to the second embodiment of the present invention will now be explained referring to FIG. 3. FIG. 3 is a vertical cross-sectional view showing the composition of the pressure sensor.

The pressure sensor 1–2 according to the second embodiment is a pressure sensor 1—1 according to the first embodiment shown in FIG. 1 to which is added a second circuit board 45 and a three-terminal condenser 46 having large capacity, for example 22000 pF.

A relay lead 47 is provided to the second circuit board 45, and electrically connects the lead 42 and the terminal 80. The second circuit board 45 may be a printed-circuit board, or may be a flexible printed-circuitboard. In the lattercase, the relay lead 47 may be omitted and the land portion provided to the printed-circuit board may be connected directly to the terminal 80.

The three-terminal condenser 46 is connected in parallel to the perforating condenser, and is connected in between the lead 42 and the pressure case 60.

All other aspects are substantially the same as the pressure sensor 1—1 according to the first embodiment.

Figure 4:
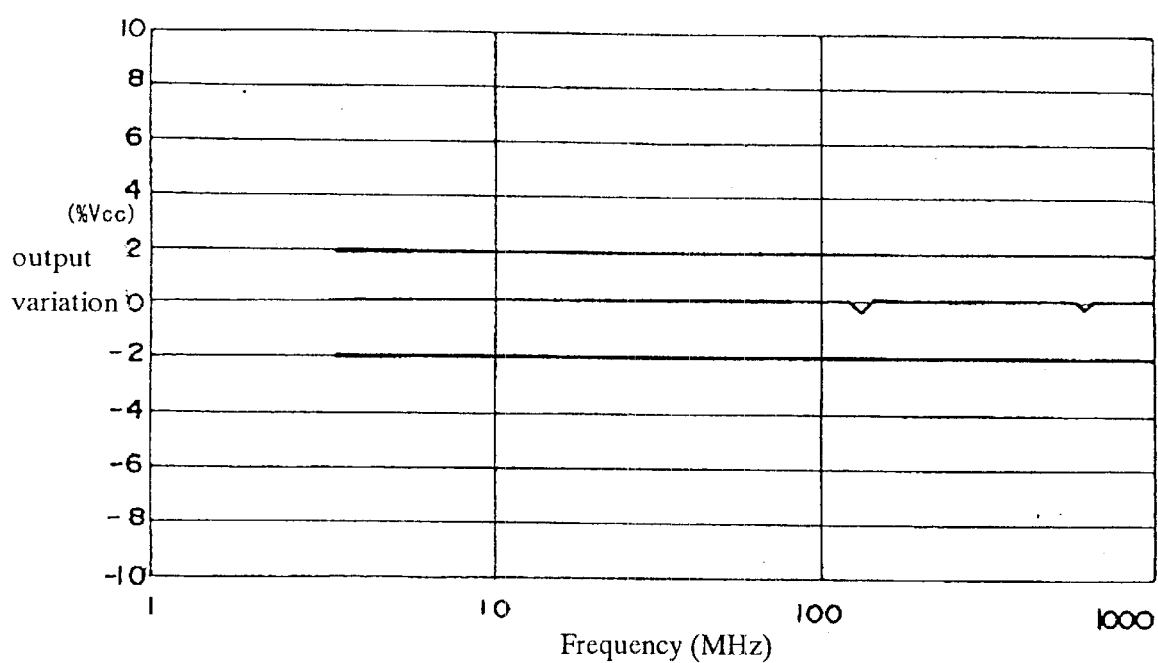
FIG. 4 is a graph showing the output characteristic of the pressure sensor according to the second embodiment of the present invention.

The pressure sensor 1–2 having the composition mentioned above could, as is shown in FIG. 4, keep the variation of the output voltage within the range of ±2% when electromagnetic noise of 10 MHz or lower is supplied, and the variation of the output voltage is kept within the range of +2% when electromagnetic noise in the range of 10 MHz to 100 MHz is supplied, thereby considerably reducing the variation of the output voltage.

Figure 5:
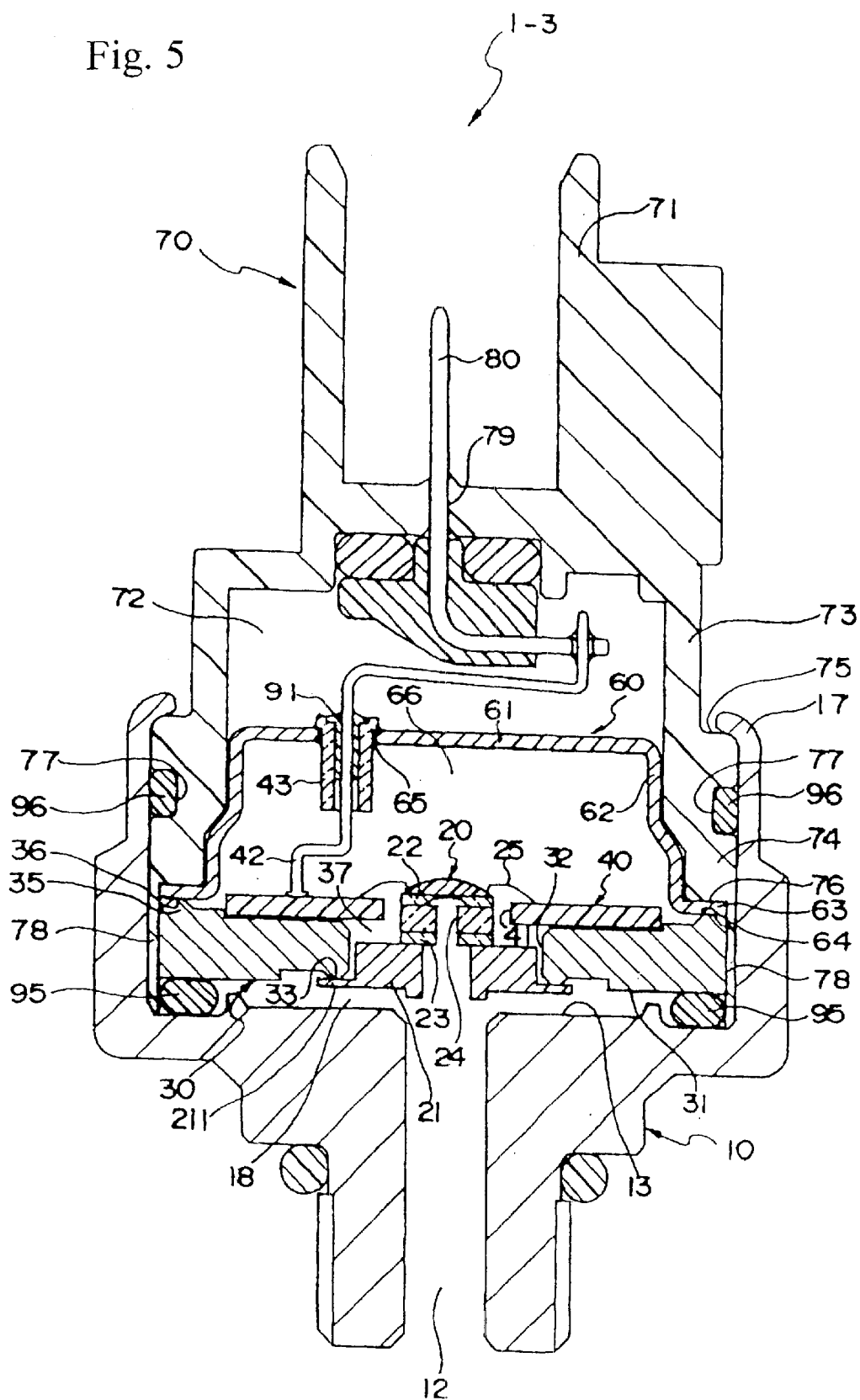
FIG. 5 is a vertical cross-sectional view showing the configuration of the pressure sensor according to the third embodiment of the present invention.
Figure 6:
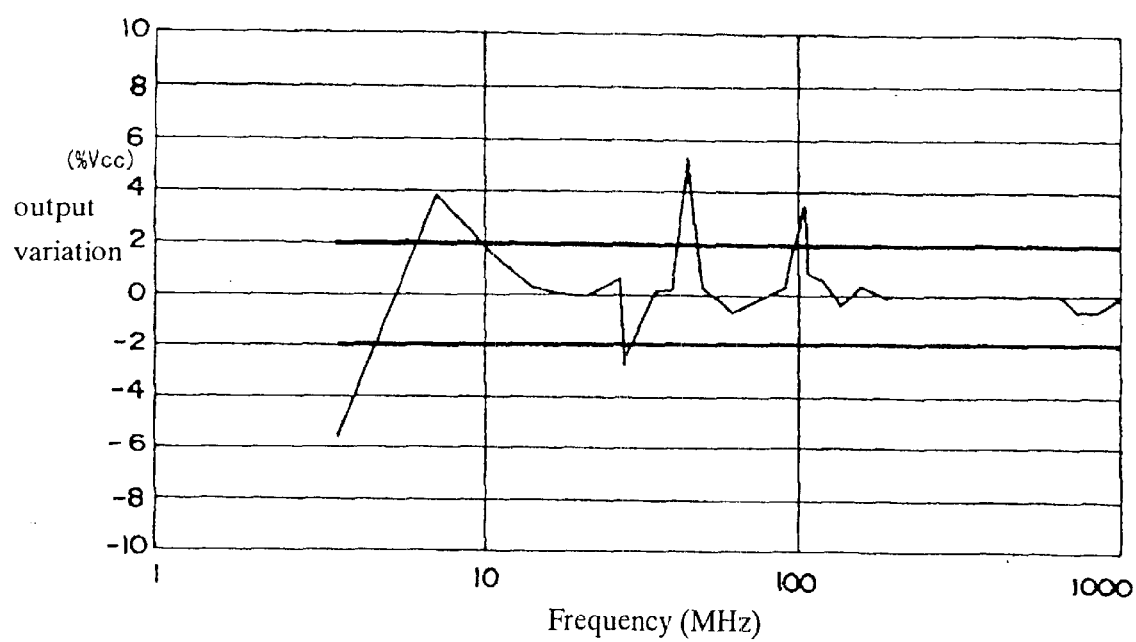
FIG. 6 is a graph showing the output characteristic of the conventional pressure sensor.

The pressure sensor 1–3 according to the third embodiment of the present invention will now be explained referring to FIG. 5. FIG. 5 is a vertical cross-sectional view showing the composition of the pressure sensor.

The pressure sensor 1–3 according to the third embodiment is characterized in that the insulating sleeve 80 of the pressure sensor 1 according to the first embodiment shown in FIG. 1 is substituted by an insulating sleeve 78 formed by thinning the lower end portion of the connector case 70.

The pressure sensor body and the housing 10 are insulated by the insulating sleeve 78. Therefore, as is in the first embodiment, it could obtain the output voltage with influence of electromagnetic noise of 10 MHz or lower being eliminated The reason for being able to reduce the influence of electromagnetic noise to the output voltage by interposing the insulating sleeve in between the housing 10 and the pressure sensor body is considered that, the surface contacting the insulating sleeve of the pressure sensor becomes a first electrode, the surface contacting the insulating sleeve of the housing 10 becomes a second electrode, and the electromagnetic noise could be earthed by the condenser comprising the insulating sleeve being inserted as a dielectric in series to the perforating condenser.

As is explained above, the subject invention provides a pressure sensor that lowers the,influence of high-frequency electromagnetic noise to the output voltage, in an absolute pressure sensor being vacuum or in a shield gauge pressure sensor being in given gas pressure at the pressure case which is highly airtight and highly confident.

We claim:

1. A pressure sensor comprising a housing having a pressure induction hole, a sensor element comprising:

semiconductor elements having piezoresist effects, a holder for fixing said sensor element, and a pressure case having an electromagnetic shield effect, wherein said sensor element, said holder and said pressure case are welded airtightly so as to define a pressure sensor body including a reference pressure space, said pressure sensor body being retained in an electrically insulated manner within said housing, and wherein an electric insulator constituting the electric insulation between said pressure sensor body and said housing is an insulating sleeve formed of an electric insulator having a rising portion at the peripheral thereof and inserted between said pressure sensor body and said housing.

2. A pressure sensor according to claim 1, wherein a connector case with one end open and formed of an electric insulator is mounted to the upper area of said pressure sensor body, and the opening end portion of said connector case is extended so as to constitute said electric insulator.

3. A pressure sensor according to any one of claims 1 and 2, wherein a perforating condenser is provided airtightly to said pressure case, and said perforating condenser introduces the output from said sensor element to a predetermined external terminal.

4. A pressure sensor according to claim 3, wherein a large capacity condenser is connected in parallel to said perforating condenser.

* * * * *